United States Patent [19]

Watanabe

[11] Patent Number: 5,280,448
[45] Date of Patent: Jan. 18, 1994

[54] DYNAMIC MEMORY WITH GROUP BIT LINES AND ASSOCIATED BIT LINE GROUP SELECTOR

[75] Inventor: Makoto Watanabe, Kanagawa, Japan

[73] Assignee: Sony Corporation, Tokyo, Japan

[21] Appl. No.: 271,913

[22] Filed: Nov. 16, 1988

[30] Foreign Application Priority Data

Nov. 18, 1987 [JP] Japan .............................. 62-291297
Nov. 18, 1987 [JP] Japan .............................. 62-291298

[51] Int. Cl.⁵ .......................................... G11C 11/407
[52] U.S. Cl. ......................... 365/189.02; 365/189.12; 365/222; 365/230.03; 365/230.06; 365/230.04
[58] Field of Search ................... 365/189.02, 230.02, 365/230.03, 189.04, 189.12, 236, 239, 240, 230.06, 222, 230.04

[56] References Cited

U.S. PATENT DOCUMENTS

| | | | |
|---|---|---|---|
| 4,581,720 | 4/1986 | Takemae et al. | 365/222 |
| 4,599,709 | 7/1986 | Clemons | 365/200 |
| 4,725,987 | 2/1988 | Cates | 365/189.04 |
| 4,773,048 | 9/1988 | Kai | 365/230.03 |
| 4,802,134 | 1/1989 | Tsujimoto | 365/189.05 |
| 4,817,054 | 3/1989 | Banerjee et al. | 365/189.05 |
| 4,849,937 | 7/1989 | Yoshimoto | 365/189.05 |
| 4,855,959 | 8/1989 | Kobayashi | 365/189.05 |
| 4,879,692 | 11/1989 | Tokushige | 365/230.03 |
| 4,914,630 | 4/1990 | Fujishima et al. | 365/189.04 |
| 4,999,814 | 3/1991 | Hashimoto | 365/222 |

FOREIGN PATENT DOCUMENTS

| | | |
|---|---|---|
| 0182719 | 5/1986 | European Pat. Off. . |
| 0188134 | 7/1986 | European Pat. Off. . |
| 0220189 | 9/1986 | Japan .............................. 365/189.04 |

Primary Examiner—G. A. Gossage
Attorney, Agent, or Firm—Hill, Steadman & Simpson

[57] ABSTRACT

A dynamic type memory used as a video memory achieves high speed access operations, reduction of occupying area of the memory, and a stablization of data holding (retention) characteristics, through the use of an organization dividing plural bit lines of the memory into bit line groups, and selecting one group at a time for connection with a register. A design of a system using the dynamic type memory can be facilitated due to the installation of delay circuits in the memory.

3 Claims, 6 Drawing Sheets

FIG. 1 *(PRIOR ART)*
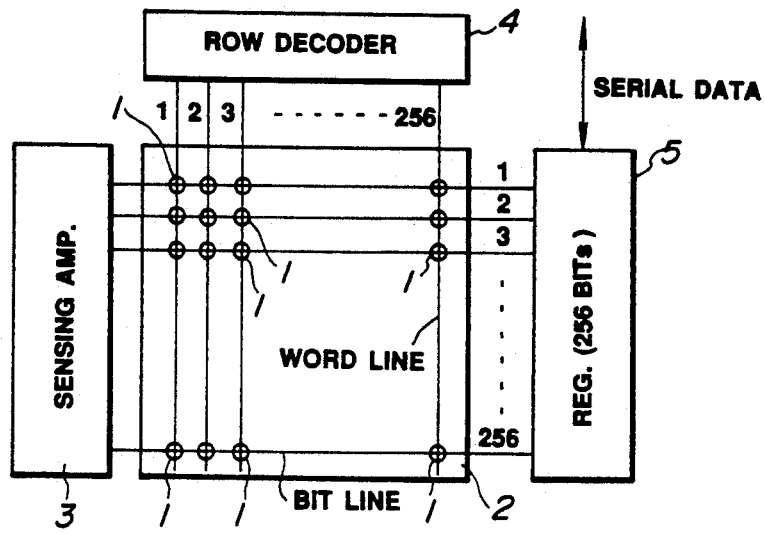
FIG. 2 *(PRIOR ART)*
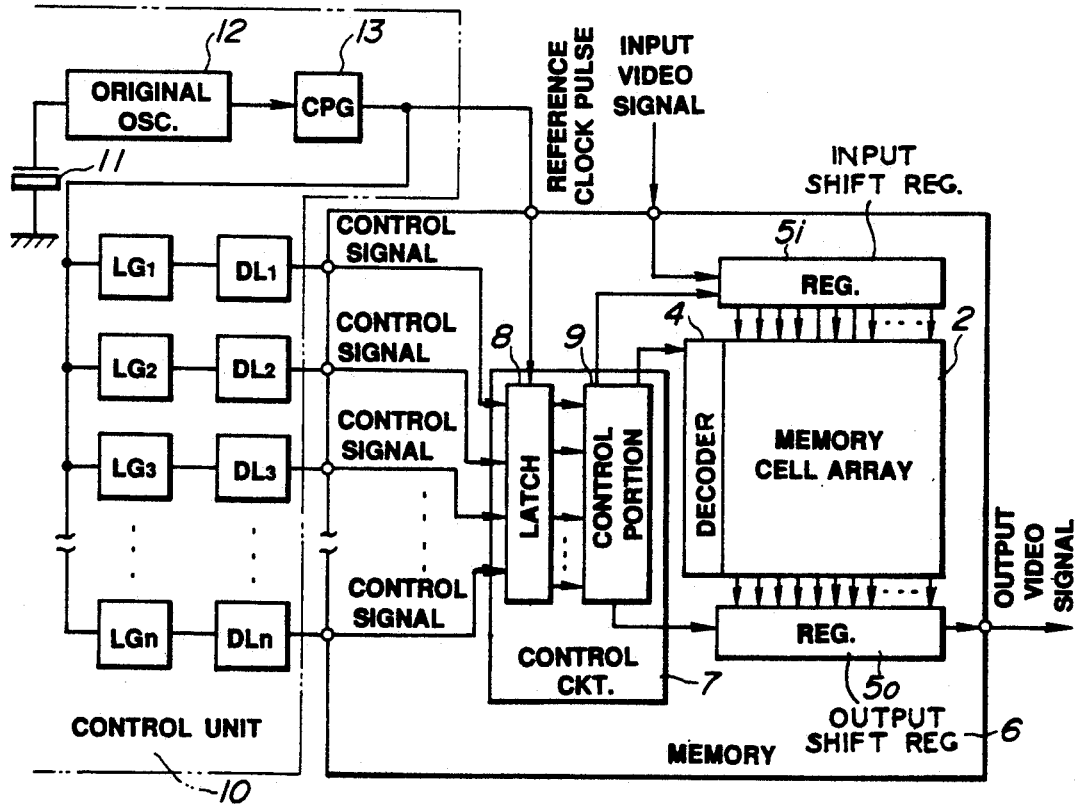

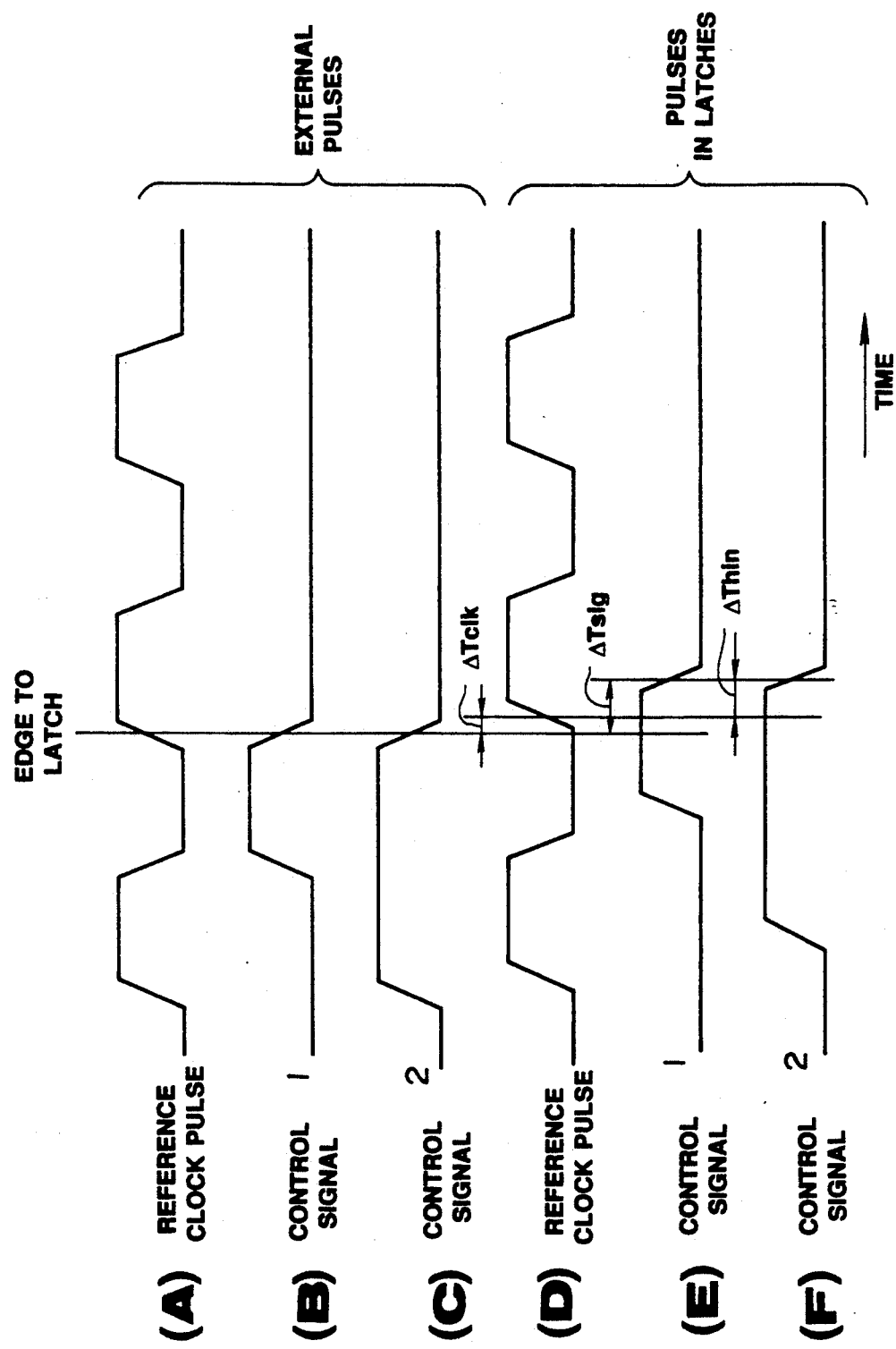

DYNAMIC MEMORY WITH GROUP BIT LINES AND ASSOCIATED BIT LINE GROUP SELECTOR

BACKGROUND OF THE INVENTION (1) Field of the invention

The present invention relates to a structure of a dynamic type memory applicable to a video memory device and particularly to the structure of a dynamic type memory in which data input/output to and from a memory cell array is carried out via a register. The register converts input or output signals from serial-to-parallel form or parallel-to-serial form.

(2) Description of the prior art

FIG. 1 shows a conventional video memory.

In FIG. 1, numeral 1 denotes each memory cell, numeral 2 denotes a memory cell array (64 Kilobits or 64 KB) constituted by a plurality of the memory cells, numeral 3 denotes a sensing amplifier, numeral 4 denotes a row decoder, and numeral 5 denotes a register for converting a video signal having 256 bits for each horizontal period (H) read from the memory cell array 2 in a bit-parallel form into a bit-serial form.

The video memory shown in FIG. 1 transfers, for example, a 256-bit signal (read via a single word line selected by means of the row decoder 4) to the register 5, which register has a number of bits equal to the number of bit lines, in bit-parallel form, the register 5 outputting the 256-bit signal to an external device from the video memory in the bit-serial form. A high-speed reading of such a serial data is carried out by repetitions of switching the selected one of the word lines. In addition, such a video memory of a dynamic memory cell type is commonly used since it is superior in its high-speed processing capability, high-density integration, and reduced power consumption.

In a case where the video memory shown in FIG. 1 is constituted by the dynamic type memory described above, a holding capability of holding information stored in each memory cell 1 for a period of time more than a constant duration is necessarily required. As a large storage capacity of the memory is advanced along with a higher quality of video images, a higher holding capability is required for each memory cell. It becomes difficult to meet such a higher demand.

A more detailed description of its difficulty in meeting the demand will be made as follows.

That is to say, the video memory shown in FIG. 1 needs to continue to hold a stored signal for a time duration from a time when one of the word lines to access the stored signal in the corresponding memory cell is selected up to a next time when the same word line is selected. The selection of the word lines is carried out in such an order that at first the first word line, secondly the second word line, and finally the 256th word line and in this order one reading of the memory signals is completed. Upon completion of the reading of the stored signal from the 256th word line, the reading is returned to the first word line. The time duration required to hold the stored signal is a product of a cycle time of the serial data, the number of bit lines, and the number of the word lines. Specifically, suppose that the cycle time is 70 nanoseconds (nS) in the case of 64 KB video memory. The time duration described above is 4.6 milliseconds (mS). In the case of 256 KB video memory the time duration amounts to 18 mS. Therefore, it is not easy for all memory cells to hold the stored signals for such a long time duration. This provides the cause of reducing a yield of the video memory products, and a major problem arises due to the strict demand for the memory cells to have the high information holding capabilities.

On the other hand, in the conventional video memory shown in FIG. 1, the capacity of the register 5 which converts the video signal in the bit-parallel form into the bit-serial form needs to be, for example, 256 bits per one horizontal line (1H). Therefore, an occupying area of the register 5 becomes very large so that an area of one semiconductor chip for the dynamic type memory needs accordingly to be large.

Furthermore, the following problem occurs in the conventional video memory shown in FIG. 2.

In FIG. 2, numeral 6 denotes a portion of the video memory, numeral 2 denotes the memory cell array comprising a multiple number of storage elements. Numeral 5i denotes an input shift register for converting the input video signal inputted in the serial form into the parallel signal for one horizontal line (H), the video signal in the parallel form stored in the shift register $5_i$ being stored in the memory cell array 2. Numeral $5_o$ denotes the shift register outputting the bit-serial signals with the video signal read from the memory cell array 2 in the bit-parallel mode stored.

Numeral 4 denotes a row decoder, numeral 7 denotes a control circuit which latches external control signals in response to a reference clock pulse externally provided and controls the memory cell array 2 in response to the respective control signals. The control circuit 7 includes a latch portion 8 which latches the control signals and a control portion 9 controlling the memory cell array 2.

Numeral 10 denotes a control unit for controlling the memory 6 externally. Control signals produced on the basis of the reference clock pulse and also the reference clock are supplied to the memory portion 6. Numeral 11 denotes a crystal oscillator, numeral 12 denotes an original oscillator for generating an original oscillating pulse using the crystal oscillator 11. Numeral 13 denotes a clock pulse generator for dividing and shaping the output signal from the original oscillator 12 to generate a reference clock pulse (3.58 (subcarriers)×4 MHz). Symbols LG 1 to LG n denote logic circuits for providing desired various kinds of control signals from the above-described reference clock pulse. Symbols DL 1 to DL n denote delay circuits for delaying the control signals produced by the logic circuits LG 1 to LG n by a predetermined time. The respective control signals are delayed by means of the delay circuits DL and inputted into the memory portion 6.

The reasons that the control signals are delayed by means of the delay circuits and applied to the memory 6 will be described below.

That is to say, each control signal needs to rise or fall at a timing prescribed according to a set-up time or hold time determined according to characteristics and capabilities of the control circuit 7 of the memory portion 6 with respect to the falling edge (or rising edge) of the reference clock pulse.

For example, to latch the control signals, as shown in FIG. 3, each control signal needs to rise (or fall) prior to, e.g., the rising edge of the reference clock pulse by at least more than set-up time and each control signal needs to be held in the rising state (or falling state) during the hold time after the reference clock pulse rises. However, the control signal derived from each logic circuit LG is synchronized with the rising edge (or falling edge) of the reference clock pulse. The control signal cannot rise (or fall) prior to the rising edge of the rising (or falling) of the reference clock by the set-up time and holds its rising state (or falling state) until the passage of time of the hold time after the reference clock pulse rises (or falls). This is called the requirements of the set-up time and hold time, which must be satisfied. In order to meet the requirements of the set-up time and hold time, an appropriate delay needs to be provided for each control signal. The delay circuits DL 1, DL 2, ... DL n are installed to provide the delays.

Another major problem arises in the conventional video memory.

The delay time provided for the control signals by means of the above-described delay circuits DL 1, DL 2, ..., DL n is not dependent on the performance of the control circuit 7 but dependent on the performance of the memory 6. Therefore, the design of the control circuit 7 needs to follow the selection of the memory.

A video equipment manufacturer needs to manufacture logic circuits and/or delay circuits after the selection of one of the video memories manufactured by a semiconductor manufacturer. Therefore, an interval of time from the time when a new product is developed to a time when the new product is sold becomes very long so that it becomes difficult to adapt such a recent trend that a life cycle of a new product becomes shortened.

SUMMARY OF THE INVENTION

It is an object of the present invention to provide an improved dynamic type memory such as a video memory in which information holding time of each memory cell can be reduced.

The above-described object can be achieved by providing the dynamic type memory in which a memory cell array is divided into a plurality of column groups, when, e.g., the stored signals are read, signals on a bit line group selected by means of a bit line group selector are converted into a serial signal by means of a register, and the bit line group selector operates to switch the selected one of the bit line groups at the end of refreshing operations, when all word lines have been selected.

The above-described object can also be achieved by providing a dynamic type memory which is activated in response to control signals latched in response to a reference clock pulse and in which delays required for the control signals to assure a normal operation are provided by means of a delay circuit installed in the memory, in order to enable controls for the operation of the memory by providing control signals synchronized with the reference clock pulse signal.

BRIEF DESCRIPTION OF THE DRAWINGS

FIGS. 1, 2, and 3 are schematic circuit block diagrams and a signal timing chart of conventional dynamic type memory and video memory circuit for explaining a hold time and set-up time for the apparatus shown in FIG. 2.

FIG. 8 is a timing chart of signals for explaining an operation of the third preferred embodiment shown in FIG. 7.

DETAILED DESCRIPTION OF THE PREFERRED EMBODIMENTS

Reference will hereinafter be made to the drawings in order to facilitate understanding of the present invention.

Figure 3:
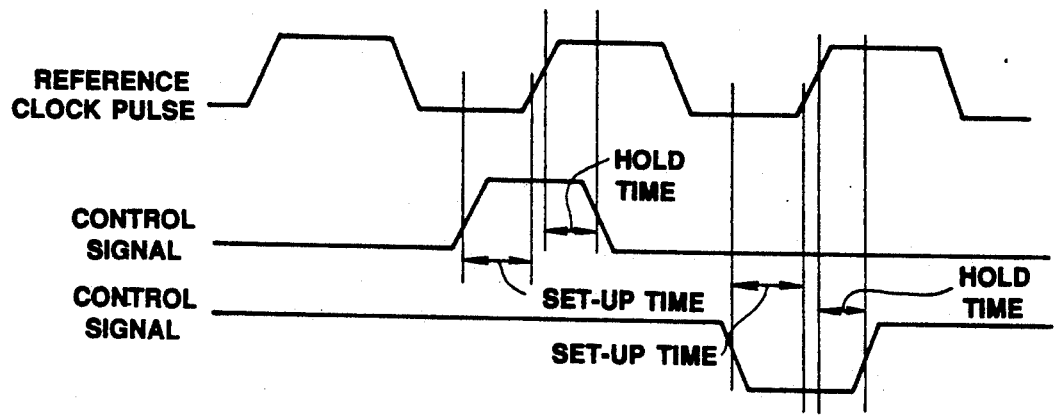

A conventional video memory is already described in an item (2) of Description of the prior art with reference to FIGS. 1 to 3.

FIRST PREFERRED EMBODIMENT

Figure 4:
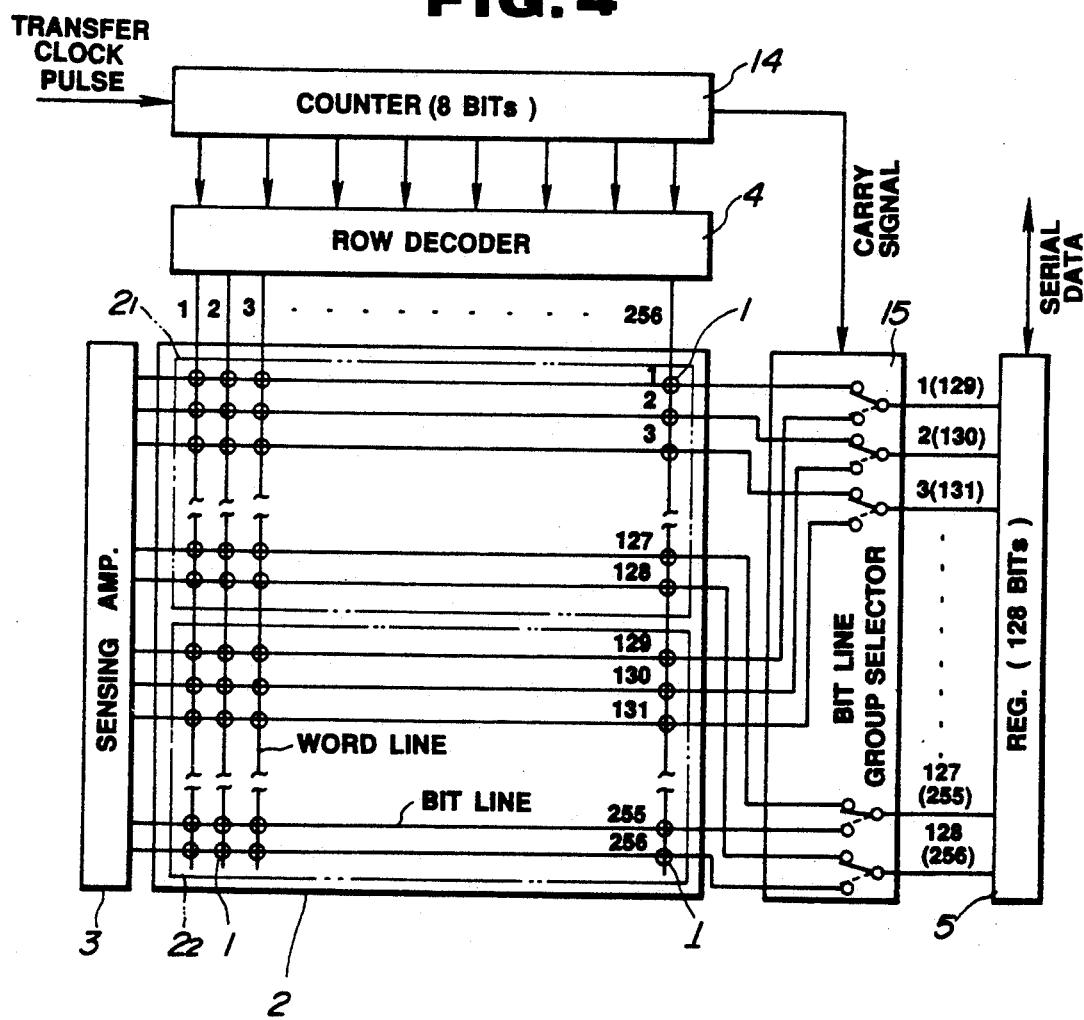
FIG. 4 is a schematic circuit block diagram of a dynamic type video memory in a first preferred embodiment according to the present invention.

FIG. 4 shows a schematic circuit block diagram of a video memory in a first preferred embodiment according to the present invention.

In FIG. 4, numeral 1 denotes one of a plurality of memory cells, numeral 2 denotes a memory cell array constituted by the memory cells 1. The memory cell array 2 is divided into two bit line groups $2_1$ and $2_2$. That is to say, a first bit line group $2_1$ is constituted by first to 128th bit lines and a second bit group $2_2$ is constituted by 129th to 256th bit lines. Numeral 3 denotes a sensing amplifier. Numeral 4 denotes a row decoder sequentially selecting one of the word lines one by one. Numeral 5 denotes a shift register for converting input signals from a bit-serial form into a bit-parallel form and vice versa. The number of bits that the register has is 128. Numeral 14 denotes an 8-bit counter for counting the number of transferring clock pulses and switching a selected word line sequentially via the row decoder 4. Numeral 15 denotes a bit line group selector disposed between the memory cell array 2 and register 5. The bit line group selector 15 includes switches having the same number as that of the bit lines in each bit line group (in the first preferred embodiment 128). Each switch has two switched terminals and one common terminal. The common terminal is connected to each bit input of the register 5 corresponding to one bit of the bit line group selector 15. One of the switch terminals selects the first bit line group $2_1$ and the other terminal selects the second bit line group $2_2$. The switching terminal which selects the second bit line group $2_2$ is connected to the bit line corresponding to the second bit line group $2_2$.

The bit line group selector 15 is controlled by means of a carry signal of the counter 14. For example, when the carry signal is "0", all switching portions select the first bit line group $2_1$. When the carry signal is "1", all switching portions select the second bit line group $2_2$.

Next, a read operation of the video memory will be described below with reference to FIG. 4.

Supposing that the word lines are selected sequentially from a first word line to a last word line according to a command of the row decoder 4 which decodes the output signals of the counter 14 which counts the transfer clock pulses.

All the signals in 256 memory cells selected by the first word line are wholly simultaneously read, and rewrites are carried out for the respective memory cells by means of the sensing amplifier. The carry signal outputted from the counter 14 is "0". At this time, the bit line group selector 15 is presently in the switching state (denoted by the solid line) selecting the first bit line group $2_1$ (denoted by a solid line).

Hence, only the signals on the bit lines in the first bit line group $2_1$ are transferred into the register 5 via the bit line group selector 15.

Upon receipt of 128 bits of signals transferred in the bit-parallel form, the register 5 sequentially shifts and outputs the signals one bit by one bit in the order described above. Upon completion of 128 bits of signals, the word line selected on the basis of the subsequently transferred clock pulses is switched from the first word line to the second one. Then, the same operation as that when the first word line is selected is repeated. In this way, as the transfer clock pulses have arrived at the register 5, the word lines required for the reading are sequentially switched so that the 256 word lines are all selected. Then, upon completion of the operation in that state, the operation is ended with the first bit line group $2_1$ selected by means of the bit line group selector 15. A time for which the operation is carried out with the first bit line group 2 selected is approximately 2.8 mS. This is approximately 60% of the time taken in the case of the conventional video memory shown in FIG. 1.

This is because as compared with the register 5 in the video memory shown in FIG. 1 indicating 256 bits, the register in the video memory shown in FIG. 4 indicates only 128 bits and the time it takes to carry out the bit-parallel to bit-serial conversion can be shortened to one half.

Next, the operation with the second bit line group $2_2$ selected by means of the bit line group selector 15 (denoted by a broken line) will be described below.

Upon arrival of the first transfer clock pulse after the operation is ended with the first bit line selected, the row decoder 4 causes the first bit line to be selected. At this time, the carry signal transmitted from the counter 14 to the bit line group selector 15 is switched from the "0" bit to "1" bit. Then, the bit line group selector 15 is switched to the switching state selecting the second bit line group $2_2$. The 256 bit signals selected by means of the first bit line are simultaneously read and rewritten onto the corresponding bit line. The signals on bit lines belonging to the second bit line group $2_2$, i.e., the signals on the bit lines from 129th bit line to 256th bit line are transferred to the register 5 in the bit-parallel form. The register 5 converts the bit-parallel signals into the bit-serial signals and outputs the bit-serial signals. Thereafter, the same operations are carried out switching the selected word lines. When the 256th word line is selected, all stored contents of the memory cell array 2 are outputted from the register 5.

As appreciated from the foregoing, the image memory twice selects all word lines during each cycle of reading all contents of the signals stored in the memory cell array 2. That is to say, each memory cell 1 is twice refreshed while all contents of the memory cell array 2 are read. Therefore, the refresh period becomes one half of the conventional memory. Consequently, the signal holding time required for each memory cell can be shortened by one half. A strict requirement for a retention characteristic for each memory cell can be relieved and yields of manufacturing the semiconductor video memory can be improved.

Although, in the first preferred embodiment, the memory cell array 2 is divided into two so as to shorten the signal holding time required at mininum by one half, e.g., the signal holding time can be shortened to ¼ if the memory cell 2 is divided into four.

SECOND PREFERRED EMBODIMENT

Figure 5:
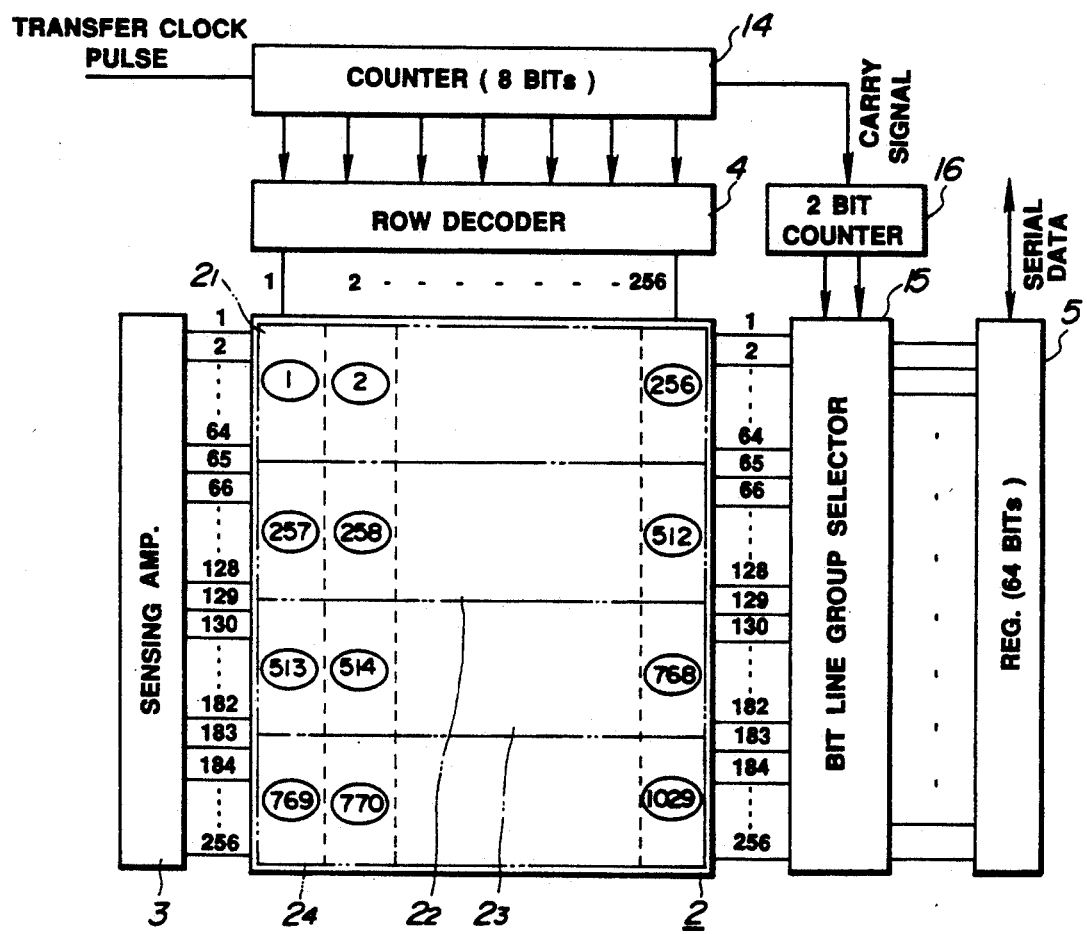
FIG. 5 is a schematic circuit block diagram of the video memory in a second preferred embodiment according to the present invention.

FIG. 5 shows a schematic circuit block diagram of the dynamic type video memory in a second preferred embodiment.

In the second preferred embodiment shown in FIG. 5, the memory cell array 2 is divided into four bit line groups $2_1$, $2_2$, $2_3$, and $2_4$. The bit line group selector 15 comprises ¼ selector selecting one bit line group specified through a two-bit control signal. Numeral 16 denotes two-bit counters for counting the number of the carry signals derived from the counter 14 and for producing the above-described two-bit control signals for controlling the bit line group selector 15. In FIG. 5, numerals enclosed with circles denote orders of accessing 64-bit data.

In such a video memory, each memory cell 1 is refreshed four times during the access cycle to all memory cells. The time to hold signal required at minimum to each memory cell can be shortened to ¼. The number of bits (capacity) for the register 5 to carry out the parallel-to-serial conversion can be reduced to ¼ its former value so that the occupying area of the register 15 can be reduced.

Figure 6:
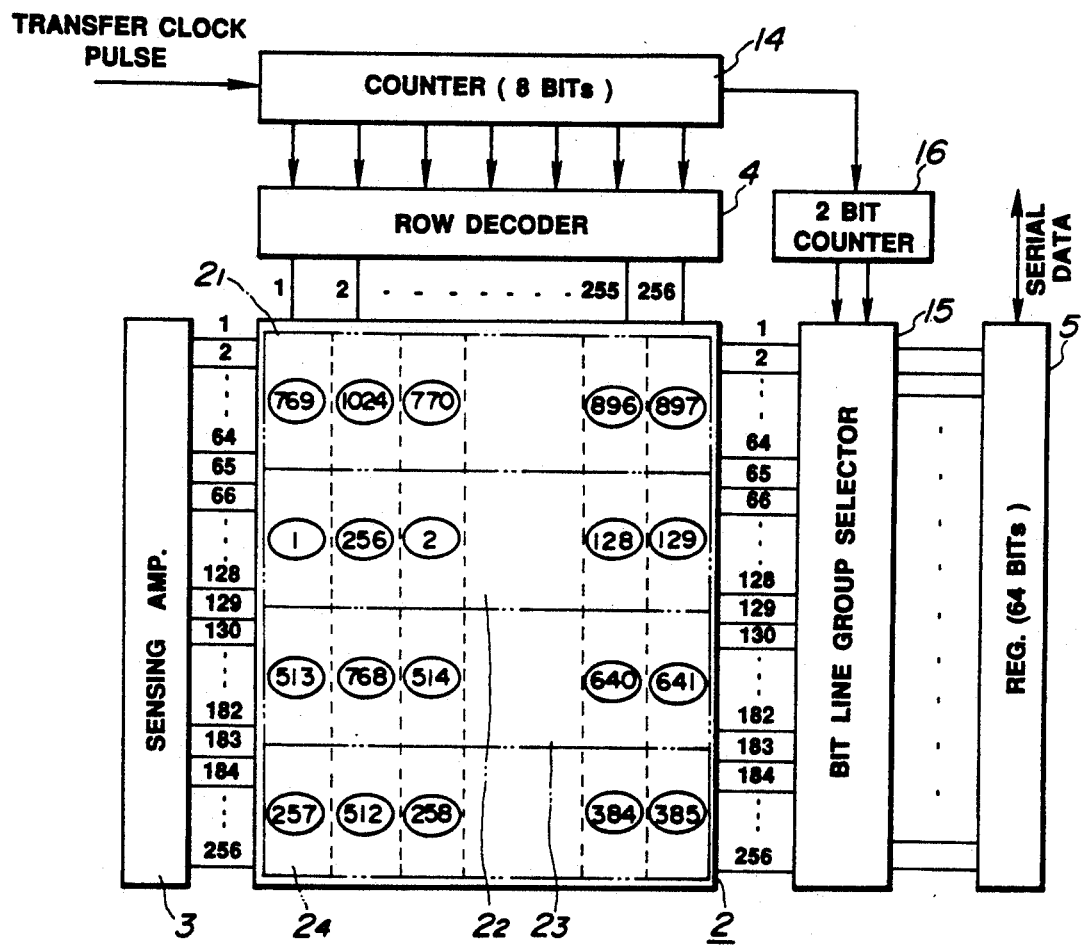
FIG. 6 is a schematic circuit block diagram of the video memory of a modification of the second preferred embodiment according to the present invention.

FIG. 6 shows a modification of the memory circuit in the second preferred embodiment.

As shown in FIG. 6, an order to access the memory cells may be varied.

In detail, the order to access data in a unit of 64 bits in an operation cycle in which one access is carried out for one memory cell is not necessarily positionally moved in order in such a way as from the first word line to the second word line or in such a way as from the first bit line group to the second bit line group. As denoted by numerals enclosed with circles, the access may be carried out in a random order. However, it is noted that, in this case, only upon completion of the access operation in a predetermined order for all word lines in a state in which one bit line group selected, the bit line group to be selected is always switched.

THIRD PREFERRED EMBODIMENT

Figure 7:
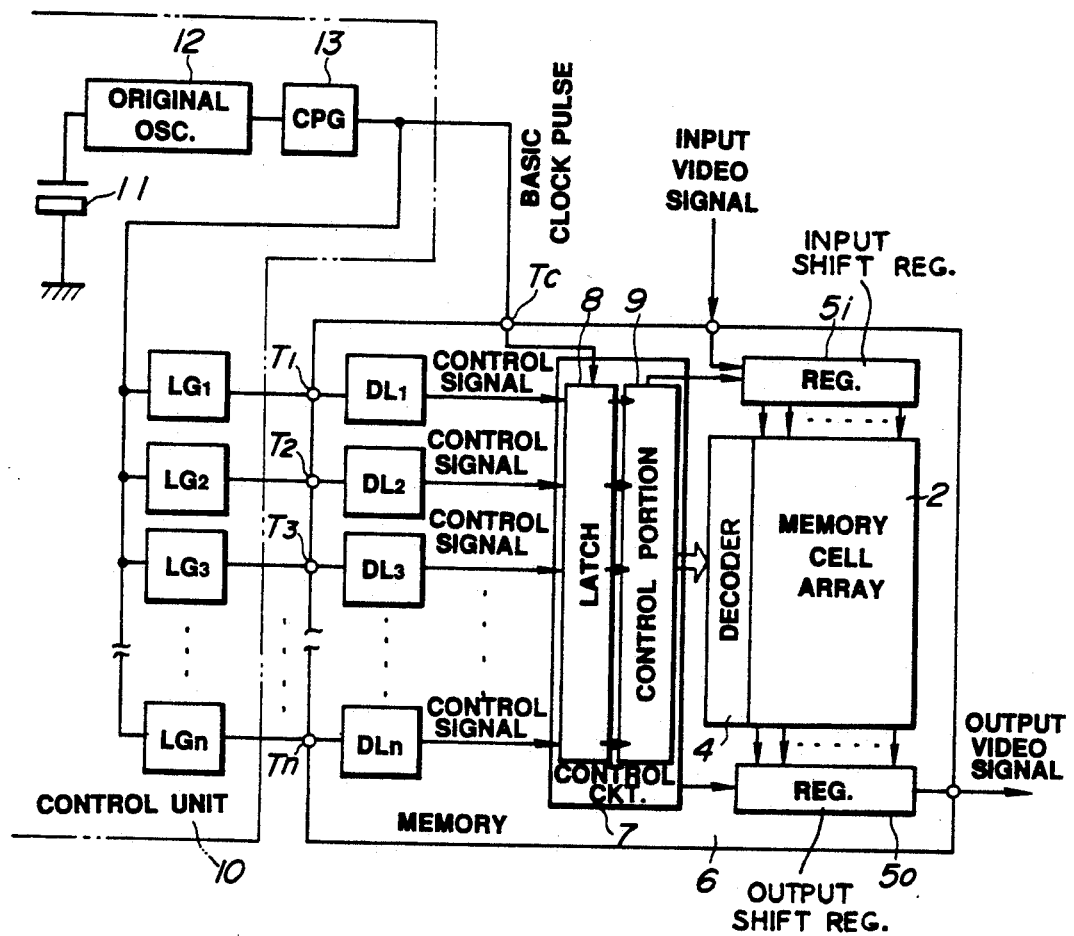
FIG. 7 is a schematic circuit block diagram of the video memory in a third preferred embodiment according to the present invention.

FIG. 7 shows a schematic circuit block diagram of the video memory in a third preferred embodiment according to the present invention.

In FIG. 7, numeral 6 denotes the video memory, numeral $5_i$ denotes an input register, numeral $5_o$ denotes an output register, numeral 4 denotes a row address decoder, numeral 7 denotes a control circuit, numeral 8 denotes a latch portion, numeral 9 denotes a control portion, symbols $DL_1$ to $DL_n$ denote delay circuits for delaying the respective control signals applied to the latch portion 8 by predetermined delays with respect to the reference clock pulse and connected between the control signal input portions $T_1$ to $T_n$ and latch portion 8. The reason for such delays is because the requirements for both the set-up time and hold time are satisfied and in the latch portion 8 each control signal is latched through the reference clock pulse without failure.

It is noted that $T_c$ denotes a reference clock pulse input portion for receiving the reference clock pulse.

Numeral 6 denotes the video memory. Numeral 10 denotes a control unit for controlling externally the video memory 6. Numeral 11 denotes a crystal oscillator, numeral 12 denotes the original crystal oscillator, numeral 13 denotes the clock pulse generator for producing the reference clock pulse, and symbols $LG_1$ to LG$_n$ denote logic circuits for generating control signals required to obtain various video effects such as stop motion, clear, etc. from the reference clock pulse through their logic operations. The respective control signals derived from the logic circuits LG$_1$ to LG$_n$ and the reference clock pulse outputted from the reference clock pulse generator 13 are inputted into the control signal input portions T$_1$ to T$_n$ of the video memory 6 and reference clock pulse input portion T$_c$.

FIG. 8 shows a signal timing chart for explaining the relationship between the reference clock pulse and control signals.

In FIGS. 8, (A), (B), and (C) show waveforms of the reference clock pulse, and two control signals which are derived from the control unit 10.

In FIGS. 8, (D), (E), and (F) show the reference clock pulse and the two control signals at the latch portion 8.

As shown in (A) to (C) of FIG. 8, the control signals supplied from the control unit 10 to the video memory 6 are synchronized with the reference clock pulse and the hold time is substantially zeroed. That is to say, in the control unit 10, each control signal may be produced through logic circuits carrying out the logic operations according to desired video effects and the control signals may not be delayed. Such delays are produced by means of the respective delay circuits DL in the memory 6.

As appreciated from (E) and (F) of FIG. 8, each control signal is delayed in the memory 6 for a time denoted by $\Delta T_{sig}$. $\Delta T_{clk}$ denotes a delay time generated when each control signal is inputted into the memory 6 and thereafter contributes to the latch in the latch portion 8. $\Delta T_{hin}$ denotes the hold time of the control signal required to latch the control signal using the reference signal in the latch portion 8. The following relationship needs to be established for the respetive delay times.

$$\Delta T_{sig} \geq \Delta T_{clk} + \Delta T_{hin}$$

The delay of more than $\Delta T_{hin}$ is required for each control signal. However, since the reference clock pulse itself is delayed by $\Delta T_{clk}$ until it contributes to the latch, at least $\Delta T_{clk} + \Delta T_{hin}$ needs to be provided for each control signal in the memory. Each delay circuit DL provided in the video memory 1 plays the above-described role.

In the way described above, since a system designer need not provide the hold time between the reference clock pulse and control signals, the design of the control unit becomes facilitated without the performance of the video memory to be adopted taken into acount. Hence, a design cost can be reduced. In addition, the time interval from the development of video memories to the mass-production and sale of the developed products of video memories can become shortened.

What is claimed is:

1. A dynamic memory, comprising:
   a) a memory array having a plurality of memory cells;
   b) a plurality of bit lines divided into a plurality of bit line groups;
   c) a plurality of word lines each associated with a number of said plurality of memory cells, for selecting for reading and refreshing said number of memory cells;
   d) a decoder for individually selecting said word lines;
   e) a register, having a number of bits which is fewer than the number of memory cells associated with each word line and which is the same as the number of bit lines of one of the plurality of bit line groups, for receiving outputs from memory cells corresponding to a selected one of said bit line groups; and
   f) a bit line group selector, disposed between the memory cell array and the register, for transferring signals between bit lines of the selected one of the bit line groups and respective bits of the register, the bit line group selector sequentially accessing all of said bit line groups each time a word line has been selected, whereby a refreshing operation is carried out for all memory cells of each selected word line.

2. A dynamic memory as set forth in claim 1, which further comprises a sensing amplifier coupled to the plurality of bit lines.

3. A dynamic memory as set forth in claim 2, wherein data in a memory cell of a selected one of the bit line groups is outputted to the register via the bit line group selector and data in memory cells in non-selected bit line groups is refreshed by means of the sensing amplifier.

* * * * *